United States Patent
Jung

(10) Patent No.: US 7,459,328 B2
(45) Date of Patent: Dec. 2, 2008

(54) IMAGE SENSOR AND METHOD OF MANUFACTURING THE SAME

(75) Inventor: Sang-Il Jung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/029,843

(22) Filed: Feb. 12, 2008

(65) Prior Publication Data

US 2008/0131990 A1    Jun. 5, 2008

Related U.S. Application Data

(62) Division of application No. 11/195,133, filed on Aug. 2, 2005.

(30) Foreign Application Priority Data

Aug. 6, 2004    (KR) ............................... 2004-62179

(51) Int. Cl.
*H01L 31/109* (2006.01)
*H01L 31/10* (2006.01)

(52) U.S. Cl. .................. 438/48; 257/446; 257/292; 257/E31.053; 257/E31.067

(58) Field of Classification Search ............... 438/48; 257/446, 292, 444, E31.053, E31.067
See application file for complete search history.

(56) References Cited

U.S. PATENT DOCUMENTS

| | | | |
|---|---|---|---|
| 6,211,509 B1 * | 4/2001 | Inoue et al. | 250/208.1 |
| 6,949,445 B2 * | 9/2005 | Rhodes et al. | 438/424 |
| 7,148,525 B2 * | 12/2006 | Mouli | 257/233 |

* cited by examiner

*Primary Examiner*—Sue A. Purvis
*Assistant Examiner*—Victor A Mandala, Jr.
(74) *Attorney, Agent, or Firm*—F. Chau & Associates, LLC

(57) ABSTRACT

An image sensor for minimizing a dark level defect is disclosed. The image sensor includes an isolation layer formed on a substrate. A field region and an active region are defined on the substrate by the isolation layer. A photodiode is formed in the image sensor in such a structure that a first region is formed below a surface of the substrate in the active region and a second region is formed under the first region. A first conductive type impurity is implanted into the first region and a second conductive type impurity is implanted into the second region. A dark current suppressor is formed on side and bottom surfaces of the isolation layer adjacent to the first region, and the dark current suppressor is doped with the second conductive type impurity. The dark current suppressor suppresses the dark current to minimize the dark level defect caused by the dark current.

7 Claims, 6 Drawing Sheets

IMAGE SENSOR AND METHOD OF MANUFACTURING THE SAME

CROSS-REFERENCE TO RELATED APPLICATION

This is a divisional application of co-pending U.S. application Ser. No. 11/195,133, filed on Aug. 2, 2005, which claims priority to Korean Appln. No. 2004-62179 filed Aug. 6, 2004, the entireties of which is incorporated herein by reference.

BACKGROUND OF THE INVENTION

1. Technical Field

The present disclosure relates to an image sensor and a method of manufacturing the same, and more particularly, to a complementary metal oxide semiconductor (CMOS) image sensor and a method of manufacturing the same.

2. Discussion of Related Art

In general, image sensors transform optical information into electrical signals. The image sensors include a CMOS type image sensor and a charge coupled device (CCD) type image sensor.

In the CCD type image sensor, each MOS capacitor is positioned adjacent to each other, and electron charges are stored into a MOS capacitor and move between MOS capacitors. In the CMOS type image sensor, the optical information is transformed into an electrical signal using a CMOS circuit, in which a control circuit and a signal processing circuit are formed in a peripheral region.

A unit pixel of the CMOS image sensor includes a photodiode for detecting light and a CMOS logic circuit for transforming the detected light into an electrical signal, thereby forming image data. The photodiode affects an optical sensitivity of the image sensor, and has been studied.

A dark level is an image defect in the CMOS image sensor. A dark current flows in the photodiode when the photodiode is not receiving any light due to electron charges being generated without a photoelectric reaction and accumulating in the photodiode. The dark current is mainly generated due to heat around a junction of the photodiode.

A plurality of hole and electron pairs are generated in the image sensor due to Joule heat caused by repeated usage of the image sensor. A plurality of crystal defects and dangling bonds are generated at a boundary portion of the active region and the field region since excessive damage and thermal and/or mechanical stress are created at the boundary portion when forming the field region. Electrons are accumulated around the crystal defects and dangling bonds. A portion of the accumulated electrons is diffused into the photodiode so that the electrons are accumulated into the photodiode. As a result, the dark current is generated due to the accumulated electrons in the photodiode and causes the dark level.

When an isolation layer in a field region is formed by a local oxidation of silicon (LOCOS) process, a boundary portion of the isolation layer is under excessive stress due to a thermal expansion during the oxidation of a substrate. The isolation layer in the field region has been formed through a shallow trench isolation (STI) process as a pixel size has been made smaller while maintaining sufficient oxide thickness for isolation. The STI process requires a dry etching process on a surface of a substrate. Due to the dry etching, the substrate in the STI process is under more excessive stress at a boundary portion adjacent to the isolation layer than the substrate in the LOCOS process. A surface of the substrate can be relieved of excessive stress by using an annealing process performed after the dry etching process. However, the dark level of a CMOS image sensor is not sufficiently reduced by the annealing process.

In a method of reducing the dark current, an image sensor is doped with P type impurities under a device isolation layer. When the P type impurities are heavily implanted under the device isolation layer, a hole and electron pair caused by heat is prevented from being diffused into the photodiode, thereby reducing the dark current. However, a portion of the electrons may be diffused into the photodiode despite the P type impurities so that a weak dark current is generated.

Accordingly, the dark current does not completely disappear in the image sensor despite the P type impurities. In addition, since the P type impurities must not contact the photodiode, a complicated manufacturing process is performed to make the image sensor.

SUMMARY OF THE INVENTION

An embodiment of the present invention provides an image sensor for reducing a dark level defect, and provides a method of manufacturing the above image sensor.

According to an embodiment of the present invention, an image sensor comprises an isolation layer on a substrate, so that a field region and an active region are defined on the substrate. A photodiode of the image sensor includes a first region under a surface of the substrate in the active region of the substrate and a second region under the first region. The first conductive type impurity is implanted into the first region and a second conductive type impurity is implanted into the second region. A dark current suppressor is formed on side and bottom surfaces of the isolation layer adjacent to the first region, and the dark current suppressor is doped with the second conductive type impurity.

According to an embodiment of the present invention, an image sensor comprising an image generator includes a plurality of unit cells arranged on a substrate. Each of the plurality of unit cells includes a signal scanning circuit and a photodiode, and an upper portion of the photodiode is doped with a first conductive type impurity and a lower portion of the photodiode is doped with a second conductive type impurity. An isolation layer for separating the unit cells from each other is formed in the image sensor, and a dark current suppressor is formed on side and bottom surfaces of the isolation layer and adjacent to the upper portion of the photodiode. The dark current suppressor is doped with the second conductive type impurity.

According to an embodiment of the present invention, there is provided a method of manufacturing an image sensor. A preliminary dark current suppressor is formed by implanting a second conductive type impurity into a surface of a substrate corresponding to a field region. An isolation layer is formed in the field region of the substrate such that the second conductive type impurity remains on lower and side surfaces thereof, thereby forming an active region defined by the field region and forming a dark current suppressor on the side and lower surfaces of the isolation layer. A second conductive type impurity is implanted into the surface of the substrate in the active region to form a second region of a photodiode. A first conductive type impurity is implanted into the second region of the photodiode adjacent to the dark current suppressor to form a first region of the photodiode.

According to an embodiment of the present invention, there is provided another method of manufacturing an image sensor. A substrate corresponding to a field region is partially etched away to form a device isolation trench in the substrate. A second conductive type impurity is implanted into side and bottom surfaces of the device isolation trench to form a dark current suppressor. The device isolation trench is filled up with an insulation layer to form a device isolation layer by which an active region and a field region are defined. The second conductive type impurity is partially implanted into a surface of the substrate corresponding to the active region to form a second region of a photodiode. A first conductive type impurity is implanted into the second region of the photodiode adjacent to the dark current suppressor to form a first region of the photodiode.

BRIEF DESCRIPTION OF THE DRAWINGS

Preferred embodiments of the present disclosure can be understood in more detail from the following descriptions taken in conjunction with the accompanying drawings, in which.

DETAILED DESCRIPTION OF PREFERRED EMBODIMENTS

Preferred embodiments of the present invention will be described below in more detail with reference to the accompanying drawings. The present invention, however, may be embodied in many different forms and should not be construed as limited to the embodiments set forth herein.

An image sensor according to an embodiment of the present invention includes an image generator having a plurality of unit cells arranged on a substrate into which a first conductive type impurity is doped. The unit cell includes a photodiode and a signal scanning circuit. The signal scanning circuit includes an active pixel sensor (APS) having an amplifier.

The photodiode includes a first region into which a first conductive type impurity is implanted and a second region into which a second conductive type impurity is implanted. The first region is formed in the substrate and the second region is formed under the first region. The first conductive type impurity has an opposite polarity to the second conductive type impurity.

The signal scanning circuit includes a plurality of transistors. The transistors include a reset transistor operated based on light passing through the photodiode, an amplifying transistor operated based on a signal from the reset transistor, and an access transistor functioning as a switch of the circuit.

A device isolation layer is formed through a shallow trench isolation (STI) process or a local oxidation of silicon (LOCOS) process to electrically separate each of the unit cells.

A dark current suppressor is formed on side and bottom surfaces of the device isolation layer and is adjacent to the first region of the photodiode. The dark current suppressor is doped with a second conductive type impurity, and is spaced apart from the second region of the photodiode, thereby being electrically separated from the second region of the photodiode.

As a result, when electron-hole pairs are generated due to heat at a boundary surface of the device isolation layer, holes are discharged from a bottom of the substrate at which voltage is a ground level, and electrons are discharged from a top of the substrate via the dark current suppressor. According to an embodiment of the present invention, the dark current suppressor electrically contacts the drain region of the signal scanning circuit for accelerating the discharge of the electrons. Since a voltage VDD is always applied to the drain region of a transistor, most of the electrons are accumulated onto the drain region of the transistor. Accordingly, the electrons are prevented from being diffused into the second region of the photodiode, thereby preventing the dark current due to the electron diffusion. As a result, a dark level defect caused by the dark current can be prevented in the image sensor.

Figure 1:
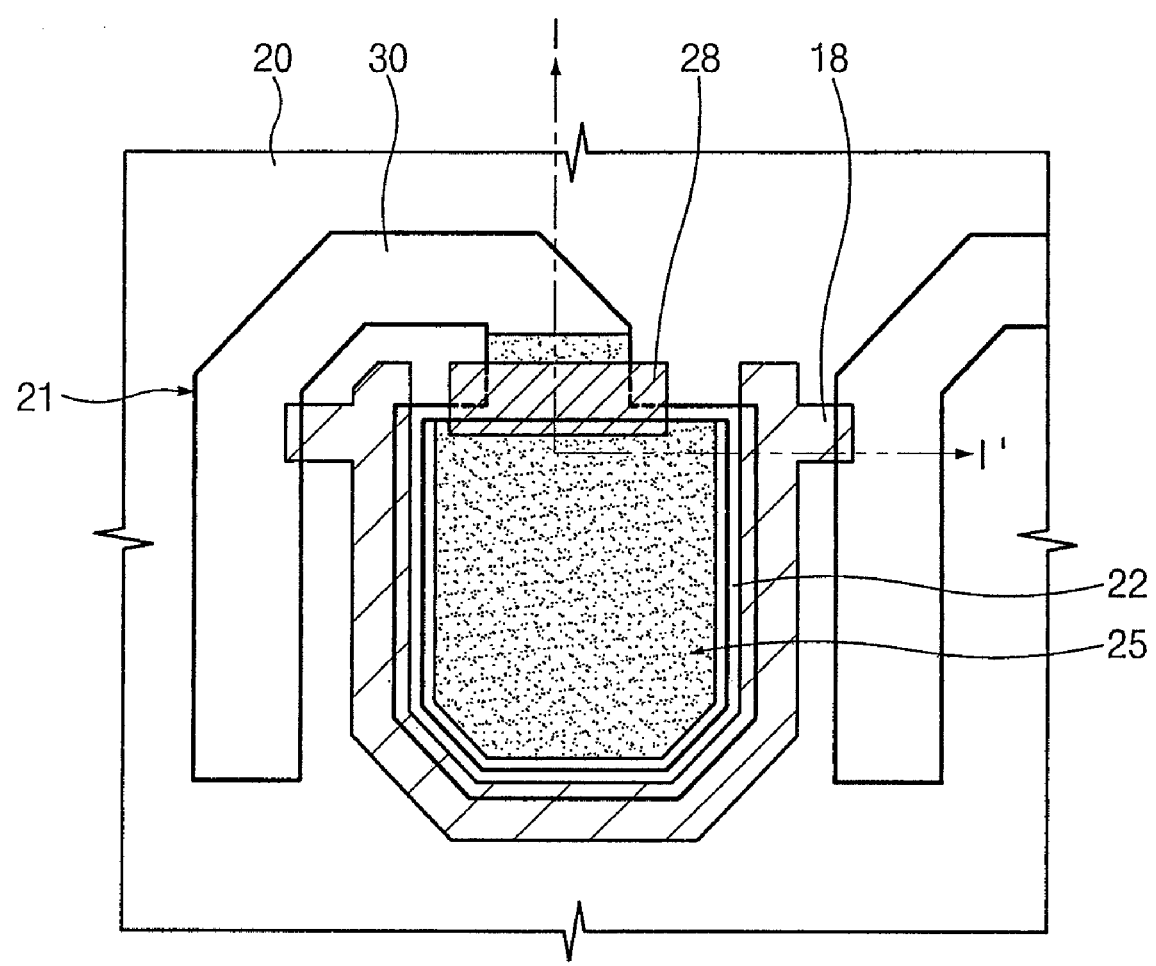
FIG. 1 is a plan view illustrating a unit cell of an image sensor according to an embodiment of the present invention.
Figure 2:
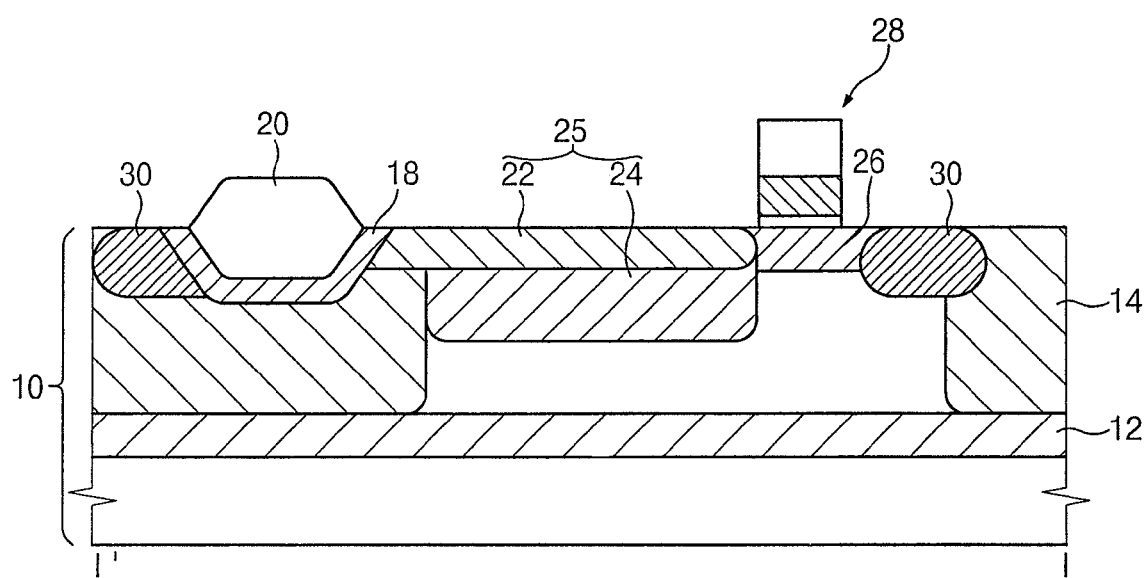
FIG. 2 is a cross-sectional view taken along the line I-I' of FIG. 1.

FIG. 1 is a plan view illustrating a unit cell of an image sensor according to an embodiment of the present invention. FIG. 2 is a cross-sectional view taken along the line I-I' of FIG. 1.

Referring to FIGS. 1 and 2, an isolation layer 20 for isolating devices on a substrate, which is referred to as a device isolation layer, is formed on a substrate 10. P type impurity is doped into the substrate 10 so that the substrate 10 is divided into an active region 21 and a field region. Each of the unit pixels in the image sensor is isolated from each other by the device isolation layer 20.

According to an embodiment of the present invention, the device isolation layer 20 is formed through a local oxidation of silicon (LOCOS) process. A surface of the substrate in the field region is oxidized and a silicon oxide is formed on the surface of the substrate in the field region. The active region 21 is electrically isolated from surroundings or other active regions by the device isolation layer 20. As a result, the active region 21 is formed as an independent and separated pattern on the substrate 10. One unit pixel of the image sensor is formed on one active region 21.

A photodiode 25 is formed under the surface of the substrate 10 in the active region 21 of the substrate 10. The photodiode 25 includes a first region 22 formed in the substrate 10 and doped with a P type impurity, and a second region 24 formed under the first region 22 and doped with an N type impurity. An example of the P type impurity includes boron (B).

A dark current suppressor 18 is formed on side and bottom surfaces of the device isolation layer 20. The first region 22 of the photodiode 25 contacts the dark current suppressor 18 while the second region 24 of the photodiode 25 is spaced apart from the dark current suppressor 18 by a predetermined distance. Accordingly, the dark current suppressor 18 is electrically connected to the first region 22 of the photodiode 25 and is electrically isolated from the second region 24 of the photodiode 25.

A well into which the P type impurity is doped (hereinafter, referred to as P-well) is formed under the dark current suppressor 18 and a portion of the first region 22 of the photodiode 25 so that the dark current suppressor 18 is surrounded by the P-well and is electrically connected to the first region 22 of the photodiode 25.

The P-well 14 contacts a side portion of the second region 24 of the photodiode 25 into which the N type impurity is doped. The P-well 14 functions as a channel stop layer with respect to the second region 24 of the photodiode 25. The second region 24 of the photodiode 25 does not electrically contact a defect portion of the device isolation layer 20 or the dark current suppressor 18 into which the N type impurity is doped due to the presence of the P-well 14. A deep well 12 is formed in the substrate 10 under the P-well 14.

As shown in FIG. 2, the first region 22 of the photodiode 25, the P-well 14, the deep well 12 and the substrate 10 are doped with the P type impurity and electrically connected with one another. The holes in the first region 22 of the photodiode 25 flow onto a bottom surface of the substrate 10 when a ground voltage is applied to the substrate 10.

The dark current, which causes a dark level defect in an image sensor, is generated by electron-hole pairs due to heat at a boundary surface of the device isolation layer 20. Holes are discharged from a bottom surface of the substrate 10 to which the ground voltage is applied. Electrons are discharged to and accumulated on the dark current suppressor 18 and the drain region 30. Since a drain voltage is applied to the drain region 30, an electrical potential energy between the P-well 14 and the drain region 30 is large. As a result, the electrons are completely discharged to the drain region 30. Accordingly, the electrons are prevented from being diffused into the second region 24 of the photodiode 25, and the dark current is reduced. As a result, the dark level defect is substantially reduced in the image sensor.

FIGS. 3 to 6 are cross sectional views illustrating a method of manufacturing an image sensor according to an embodiment of the present invention.

Figure 3:
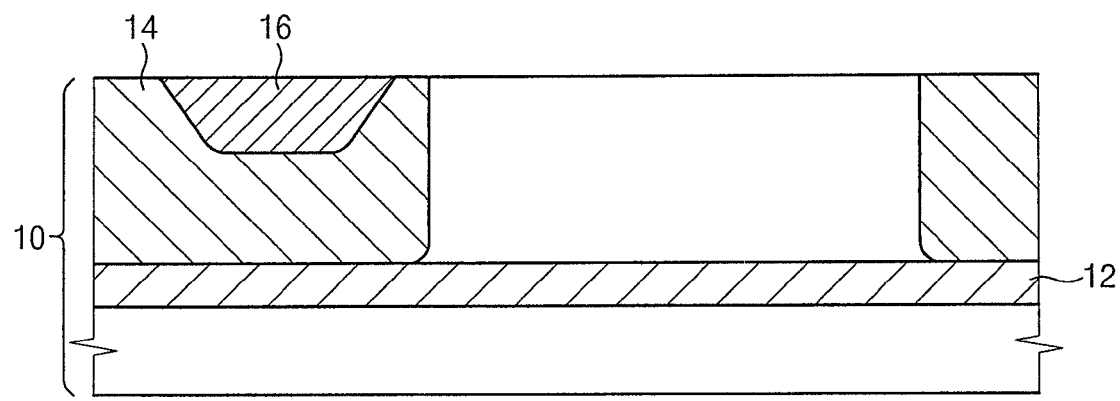
FIGS. 3 to 6 are cross-sectional views illustrating a method of manufacturing an image sensor according to an embodiment of the present invention.

Referring to FIG. 3, a substrate 10 is doped with the P type impurity. According to an embodiment of the present invention, the substrate 10 includes a silicon substrate into which a P type impurity is substantially doped. Alternatively, the substrate 10 may be an epitaxial silicon substrate in which an epitaxial semiconductor layer lightly doped with the P type impurity is formed on a silicon substrate substantially doped with the P type impurity.

The P type impurity is implanted deep into the substrate 10 so that a deep well 12 is formed in the substrate 10. The deep well 12 is vertically spaced apart from a surface of the substrate 10. Then, the P type impurity is implanted into the surface of the substrate 10, in an area where the photodiode 25 and transistors are not formed, thereby forming a P-well 14 in the substrate 10. Accordingly, the P-well 14 is doped with the P type impurity more heavily than other portions of the substrate 10. The electron-hole pairs due to the heat can be prevented from being diffused into the photodiode 25.

A bottom of the P-well 14 contacts a top portion of the deep well 12 so that the P type impurities in the P-well 14 and the deep well 12 are diffused from each other. The P type impurity for the P-well 14 is implanted into the substrate 10 to a smaller depth than that of the deep well 12. The ion implantation process for the P-well 14 and the deep well 12 may be omitted.

An N type impurity is implanted into the substrate 10 in the field region, thereby forming a preliminary dark current suppressor 16. According to an embodiment of the present invention, the N type impurity is implanted to a smaller depth than that of the P-well 14 since the preliminary dark current suppressor 16 is formed in the P-well. The N type impurity is implanted in a larger surface of the substrate than the field region to cover the field region.

Figure 4:
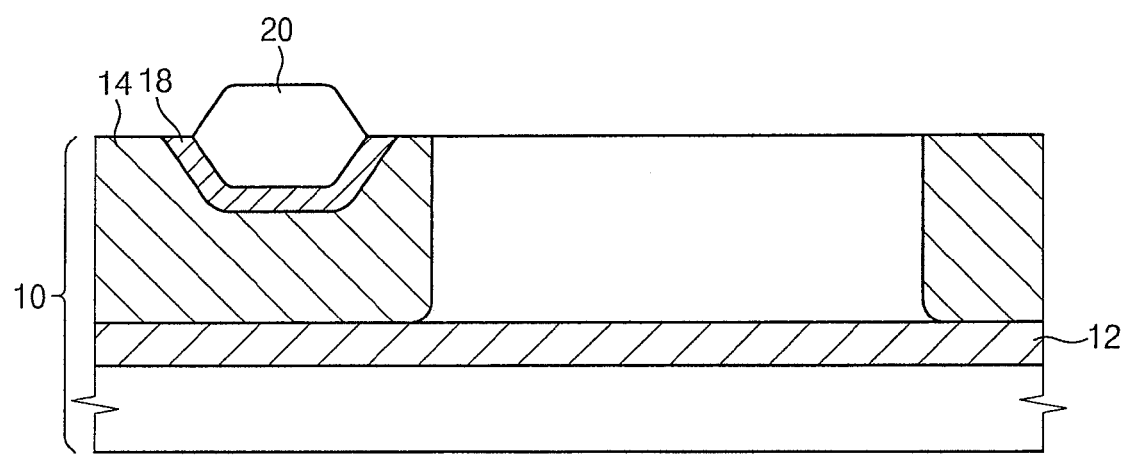

Referring to FIG. 4, a buffer oxide layer (not shown) is formed on the substrate 10 after completing the ion implantation process. A silicon nitride layer (not shown) is formed on the buffer oxide layer. Then, the buffer oxide layer and the silicon nitride layer are partially etched away, thereby forming a buffer oxide pattern (not shown) and a silicon nitride pattern (not shown) through which the substrate 10 in the field region is exposed. As a result, the exposed portion of substrate is located in the area of the preliminary dark current suppressor 16. Then, the exposed substrate 10 is thermally oxidized, thereby forming a device isolation layer 20 on a surface of the exposed substrate 10, upwardly and downwardly from the surface of the substrate 10. Accordingly, a field region and an active region are separated from each other on the substrate 10.

When the device isolation layer 20 is completed in the field region, the N type impurity remains only on side and bottom surfaces of the device isolation layer 20. Thus, a dark current suppressor 18 is formed along the side and bottom surfaces of the device isolation layer 20. Thereafter, the buffer oxide pattern and the silicon nitride pattern are removed from the substrate 10.

Figure 5:
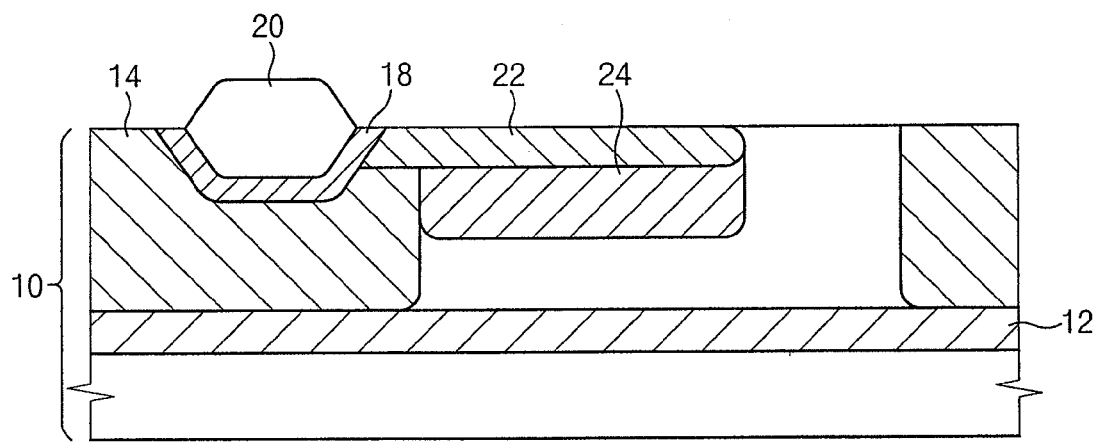

Referring to FIG. 5, an N type impurity, which is an example of a second conductive type impurity, is implanted into the surface of the substrate 10 in the active region, thereby forming a second region 24 of a photodiode. A side portion of the second region 24 of the photodiode contacts a side portion of the P-well 14. Since the P-well 14 surrounds the dark current suppressor 18, the second region 24 of the photodiode 25 is spaced apart from the dark current suppressor 18, and is not electrically connected to the dark current suppressor 18.

A P type impurity is again implanted into the surface of the substrate 10 in the active region, thereby forming a first region 22 of the photodiode 25 on the second region 24. According to an embodiment of the present invention, the P type impurity is implanted such that the first region 22 of the photodiode 25 contacts the dark current suppressor 18.

Figure 6:
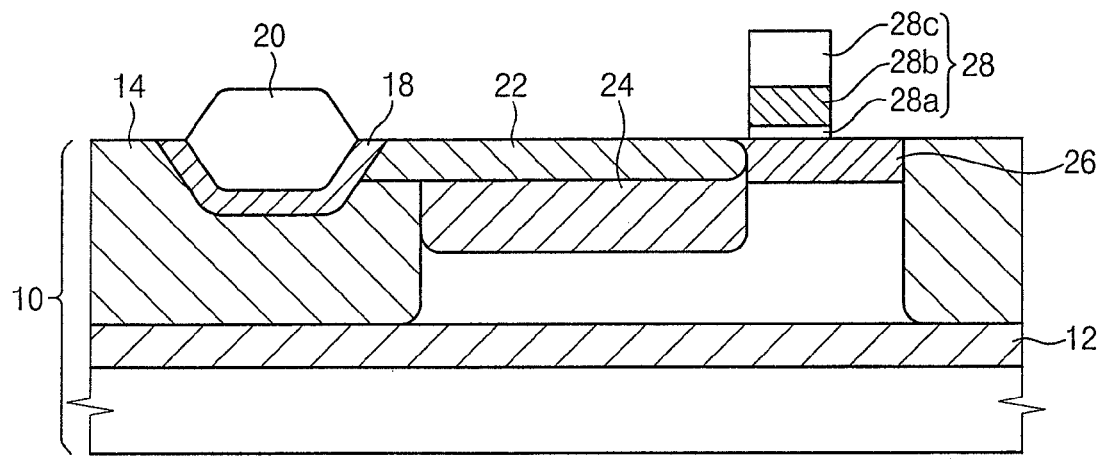

Referring to FIG. 6, a transistor is formed on the substrate 10 in the active region and around the second region 24 of the photodiode 25, and is electrically connected to the second region 24 of the photodiode 25. An N type impurity is implanted into the surface of the substrate 10 adjacent to the second region 24 of the photodiode 25, thereby forming a channel region 26 in the substrate 10. A gate insulation layer, a gate conductive layer and a hard mask layer are sequentially formed on the substrate including the channel region 26, and are patterned to form a gate structure 28 having a gate insulation pattern 28a, a gate conductive pattern 28b and a hard mask pattern 28c sequentially stacked on the substrate 10. The gate structure is disposed on and faces the channel region 26.

Then, as shown in FIG. 2, an N type impurity is implanted into the substrate 10 adjacent a side portion of the gate structure 28 more heavily than in the channel region 26, thereby forming a drain region 30 electrically connected to the channel region 26. According to an embodiment of the present invention, the drain region 30 is formed adjacent to the dark current suppressor 18 to be electrically connected to the dark current suppressor 18.

Figure 7:
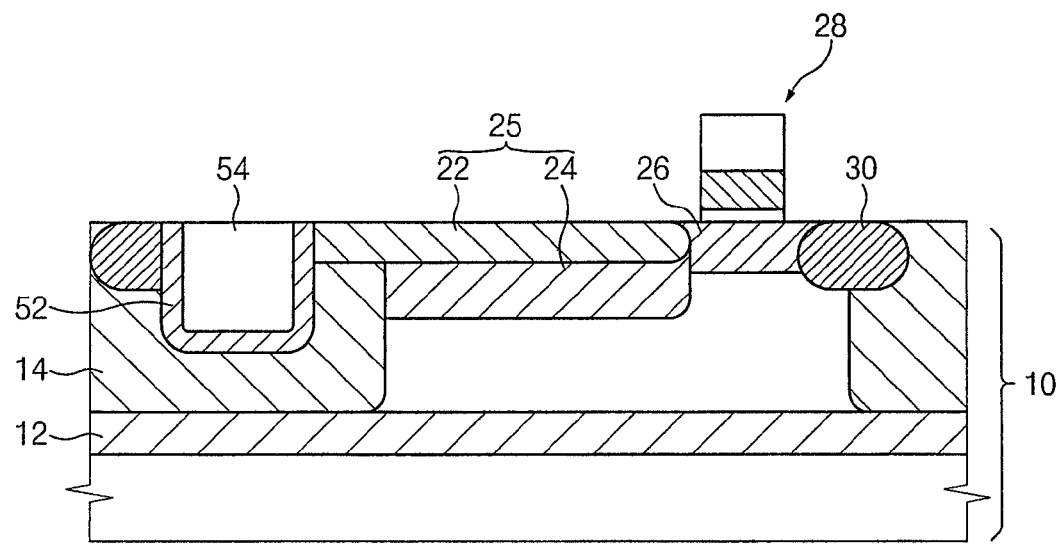
FIG. 7 is a cross-sectional view illustrating an image sensor according to an embodiment of the present invention.

FIG. 7 is a cross-sectional view illustrating an image sensor according to an embodiment of the present invention. FIG. 7 is taken along the line I-I' of FIG. 1. The image sensor in FIG. 7 is the same as the image sensor in FIG. 2 except for a shape of the device isolation layer 52. The same reference numerals will be used to refer to the same elements having a similar structure and/or function as in FIG. 2.

Referring to FIG. 7, a trench for isolating devices is formed on a surface of a substrate 10 into which a P type impurity is doped through an anisotropic etching process. A device isolation layer 54 is formed in the device isolation trench, and an active region and a field region are separated from each other on the substrate 10. A dark current suppressor 52 is formed along side and bottom surfaces of the device isolation trench. The deep well 12, the P-well 14, the photodiode 25 and the transistors are the same structure as in FIG. 2.

Figure 8:
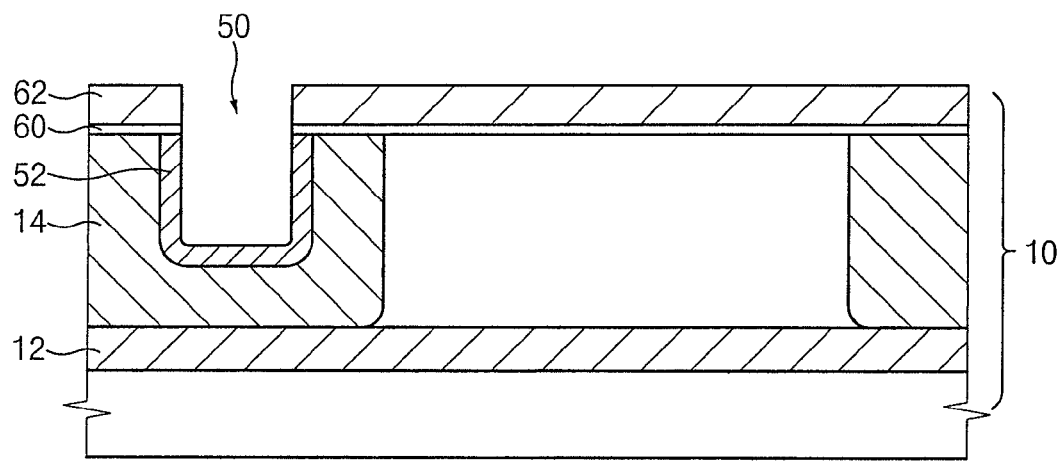
FIGS. 8 to 10 are cross-sectional views illustrating a method of manufacturing the image sensor shown in FIG. 7.
Figure 9:
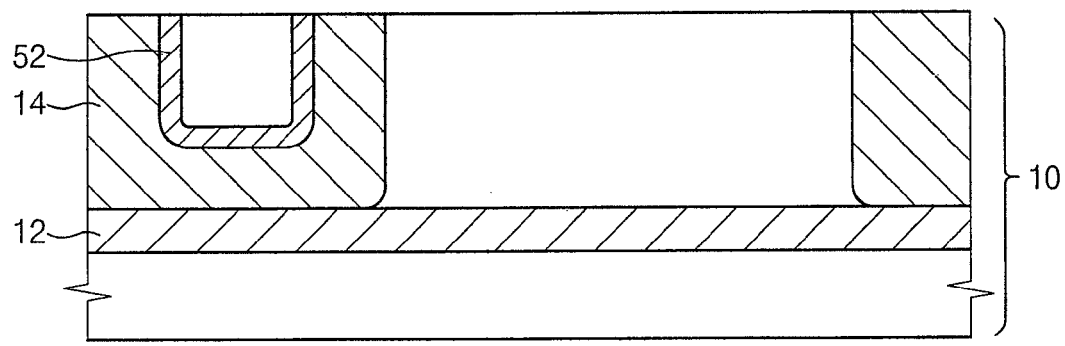
Figure 10:
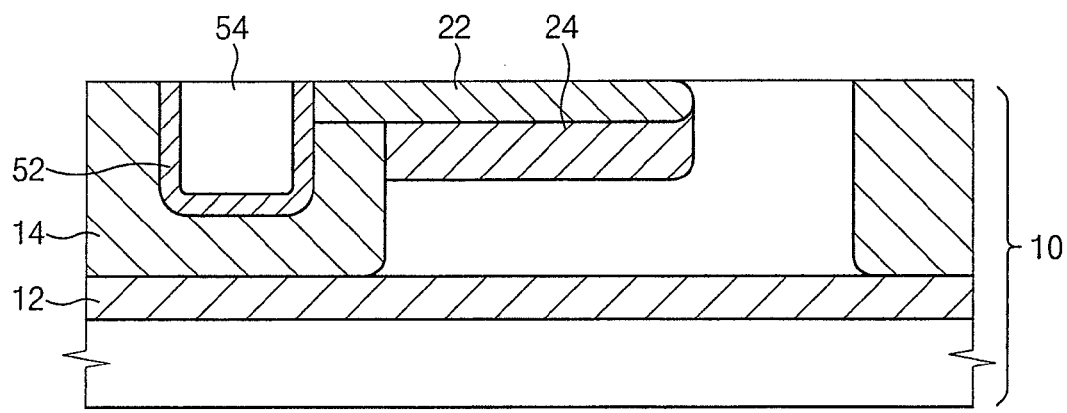

FIGS. 8 to 10 are cross sectional views illustrating a method of manufacturing the image sensor shown in FIG. 7.

Referring to FIG. 8, a substrate 10 is doped with the P type impurity. According to an embodiment of the present invention, the substrate 10 includes a silicon substrate into which a P type impurity is substantially doped. Alternatively, the substrate 10 may be an epitaxial silicon substrate in which an epitaxial semiconductor layer lightly doped with the P type impurity is formed on a silicon substrate substantially doped with the P type impurity.

The P type impurity is implanted deep into the substrate 10 so that a deep well 12 is formed in the substrate 10 vertically spaced apart from a surface of the substrate 10. Then, the P type impurity is implanted into the surface of the substrate 10 in an area where the photodiode 25 and transistors are not formed, thereby forming a P-well 14 in the substrate 10. Accordingly, the P-well 14 is doped with the P type impurity more heavily than other portions of the substrate 10 such as a portion in which the photodiode and transistors are formed, and the electron-hole pairs caused by heat are prevented from being diffused to the photodiode 25.

A bottom of the P-well 14 contacts a top portion of the deep well 12 so that the P type impurities in the P-well 14 and the deep well 12 are diffused from each other. The P type impurity for the P-well 14 is implanted into the substrate 10 to a smaller depth than that of the deep well 12. According to an embodiment of the present invention, the ion implantation process for the P-well 14 and the deep well 12 may be omitted.

A buffer oxide layer (not shown) and a hard mask layer (not shown) are formed on the substrate 10. According to an embodiment of the present invention, the hard mask layer comprises silicon nitride. Then, the buffer oxide layer and the hard mask layer are sequentially patterned, thereby forming a buffer oxide pattern 60 and a hard mask pattern 62 through which the substrate 10 corresponding to the field region is exposed. The exposed portion of the substrate 10 is etched away using the hard mask pattern 62 as an etching mask, thereby forming a device isolation trench 50 on the substrate 10.

An N type impurity is implanted into side and bottom surfaces of the device isolation trench 50 to form a dark current suppressor 52 surrounding the device isolation trench 50. The N type impurity is implanted to a smaller depth than that of the P-well 14 so that the dark current suppressor 52 is formed in the P-well 14.

Referring to FIG. 9, an insulation layer (not shown) such as a silicon oxide layer is formed on the substrate 10 to a sufficient thickness to fill up the device isolation trench 50. The insulation layer is removed and planarized until a top surface of the hard mask pattern is exposed. As a result, the insulation layer remains only in the device isolation trench 50, thereby forming a device isolation layer in the device isolation trench 50. Thereafter, the hard mask pattern 62 and the buffer oxide pattern 60 are removed from the substrate 10.

Referring to FIG. 10, an N type impurity is partially implanted into the surface of the substrate 10 in the active region, thereby forming a second region 24 of a photodiode in the substrate 10. According to an embodiment of the present invention, a side portion of the second region 24 of the photodiode contacts a side portion of the P-well 14. Since the P-well 14 surrounds the dark current suppressor 52, the second region 24 of the photodiode is spaced apart from the dark current suppressor 52, and is not electrically connected to the dark current suppressor 52.

A P type impurity is again implanted into the surface of the substrate 10 in the active region, thereby forming a first region 22 of the photodiode on the second region 24. According to an embodiment of the present invention, the P type impurity is implanted such that the first region 22 of the photodiode contacts the dark current suppressor 52.

Then, as shown in FIG. 6, a transistor is formed on the substrate 10 in the active region and around the second region 24 of the photodiode. The transistor is electrically connected to the second region 24 of the photodiode. An N type impurity is implanted into the surface of the substrate 10 adjacent to the second region 24 of the photodiode, thereby forming a channel region 26 below the surface of the substrate 10. A gate insulation layer, a gate conductive layer and a hard mask layer are sequentially formed on the substrate including the channel region 26, and are patterned to form a gate structure 28 having a gate insulation pattern 28a, a gate conductive pattern 28b and a hard mask pattern 28c sequentially stacked on the substrate 10. The gate structure is disposed on and faces the channel region 26.

Then, as shown in FIG. 7, an N type impurity is implanted into the substrate 10 adjacent to the gate structure 28 more heavily than the channel region 26 to form a drain region 30 electrically connected to the channel region 26. According to an embodiment of the present invention, the drain region 30 is formed adjacent to the dark current suppressor 52 so that the drain region 30 is electrically connected to the dark current suppressor 52.

According to an embodiment of the present invention, holes and electrons generated at a boundary surface of the device isolation layer due to heat are substantially discharged from the substrate, thereby reducing the dark level defect in an image sensor. As a result, operation characteristics and reliability of the image sensor may be improved.

Although preferred embodiments have been described herein with reference to the accompanying drawings, it is to be understood that the present invention is not be limited to these precise embodiments but various changes and modifications can be made by one skilled in the art within the spirit and scope of the present invention.

What is claimed is:

1. A method of manufacturing an image sensor, comprising: partially etching a portion of a substrate corresponding to a field region to form a device isolation trench in the substrate; implanting a second conductive type impurity into side and bottom surfaces of the device isolation trench to form a dark current suppressor; filling the device isolation trench with an insulation layer to form a device isolation layer for defining an active region and a field region; partially implanting the second conductive type impurity into a surface of the substrate corresponding to the active region to form a second region of a photodiode; and implanting a first conductive type impurity into the second region of the photodiode adjacent to the dark current suppressor to form a first region of the photodiode, wherein the dark current suppressor is electrically isolated from the second region of the photodiode and the second region is disposed under the first region.

2. The method of claim 1, further comprising implanting the first conductive type impurity into the surface of the substrate adjacent to the first region of the photodiode to form a well.

3. The method of claim 2, wherein a depth of the well is greater than a depth of the dark current suppressor from the surface of the substrate.

4. The method of claim 2, further comprising implanting the first conductive type impurity into the surface of the substrate to form a deep well under the well.

5. The method of claim 1, further comprising:
forming a channel region connected to the second region of the photodiode and doped with the second conductive type impurity;
forming a gate on the substrate facing the channel region; and
forming a drain region adjacent to the channel region, wherein the drain region is doped with the second conductive type impurity more heavily than the channel region.

6. The method of claim 5, wherein the drain region is adjacent to the dark current suppressor and electrically contacts the dark current suppressor.

7. The method of claim 5, wherein the second region of the photodiode is spaced apart from the dark current suppressor to be electrically isolated from the dark current suppressor.

* * * * *